(12) United States Patent
Sisson

(10) Patent No.: US 7,407,359 B2
(45) Date of Patent: Aug. 5, 2008

(54) FUNNEL PLATE

(75) Inventor: Thomas P. Sisson, Forest, VA (US)

(73) Assignee: Danville Automation Holdings LLC, Lynchburg, VA (US)

( * ) Notice: Subject to any disclaimer, the term of this patent is extended or adjusted under 35 U.S.C. 154(b) by 0 days.

(21) Appl. No.: 11/139,833

(22) Filed: May 27, 2005

(65) Prior Publication Data
US 2006/0280591 A1 Dec. 14, 2006

(51) Int. Cl.
B65G 65/32 (2006.01)
B65B 1/02 (2006.01)

(52) U.S. Cl. .......................... 414/404; 53/473; 53/241

(58) Field of Classification Search ................ 249/105, 249/108; 414/404, 416.09; 206/710–712, 206/714, 722, 725; 53/241, 246–248, 255, 53/260
See application file for complete search history.

(56) References Cited

U.S. PATENT DOCUMENTS

| | | | | |
|---|---|---|---|---|
| 2,970,709 A | * | 2/1961 | Gartner et al. ........... 414/788.5 |
| 3,074,526 A | * | 1/1963 | Duffy ........................ 193/29 |
| 3,224,308 A | * | 12/1965 | Dix ............................ 83/133 |
| 3,411,266 A | * | 11/1968 | Dix ............................ 53/142 |
| 3,465,874 A | * | 9/1969 | Hugle et al. ................ 206/714 |
| 4,210,243 A | * | 7/1980 | McDowell .................. 206/725 |
| 4,393,808 A | * | 7/1983 | Braden ....................... 118/503 |
| 4,395,184 A | * | 7/1983 | Braden ........................ 414/17 |
| 4,494,902 A | * | 1/1985 | Kuppens et al. ............... 221/74 |
| 5,219,404 A | * | 6/1993 | Moore et al. ................ 140/147 |
| 5,966,903 A | * | 10/1999 | Dudderar et al. ............. 53/397 |
| 6,205,745 B1 | * | 3/2001 | Dudderar et al. ............. 53/397 |
| 6,332,946 B1 | * | 12/2001 | Emmett et al. .............. 156/299 |
| 6,446,818 B1 | * | 9/2002 | Dubey et al. ............. 211/41.18 |
| 6,484,881 B1 | * | 11/2002 | Alvite ....................... 206/714 |
| 6,494,667 B1 | * | 12/2002 | Suzuki et al. ............ 414/751.1 |
| 6,505,397 B1 | * | 1/2003 | Mimata et al. ................ 29/740 |
| 6,608,370 B1 | * | 8/2003 | Chen et al. ................... 257/678 |
| 6,627,483 B2 | * | 9/2003 | Ondricek et al. ............ 438/117 |
| 6,644,982 B1 | * | 11/2003 | Ondricek et al. ............. 439/73 |
| 6,729,474 B2 | * | 5/2004 | Hong et al. .................. 206/714 |
| 6,760,968 B2 | * | 7/2004 | Mimata et al. ................ 29/740 |
| 6,772,509 B2 | * | 8/2004 | Chen et al. .................... 29/825 |
| 6,871,394 B2 | * | 3/2005 | Barretto et al. ............... 29/830 |
| 6,887,723 B1 | * | 5/2005 | Ondricek et al. ............. 438/14 |

FOREIGN PATENT DOCUMENTS

JP    09232113 A  *  9/1997
WO   WO 9320678 A1 * 10/1993

* cited by examiner

*Primary Examiner*—Saul J. Rodriguez
*Assistant Examiner*—Charles Greenhut
(74) *Attorney, Agent, or Firm*—Baker & Hostetler LLP

(57) ABSTRACT

The invention relates to a funnel plate and method of use thereof which facilitates transfer of components from a first tray to a second tray assisting in the packaging, shipping, or assembly of electronic components. The invention provides a plate which includes at least one aperture having internal surfaces which are beveled. The sloped internal surfaces of the apertures precisely aligns electrical component transfer reducing the need for complex post-alignment testing. The funnel plates and processes of the present invention are easily integrated into modern in-line transfer machines.

51 Claims, 14 Drawing Sheets

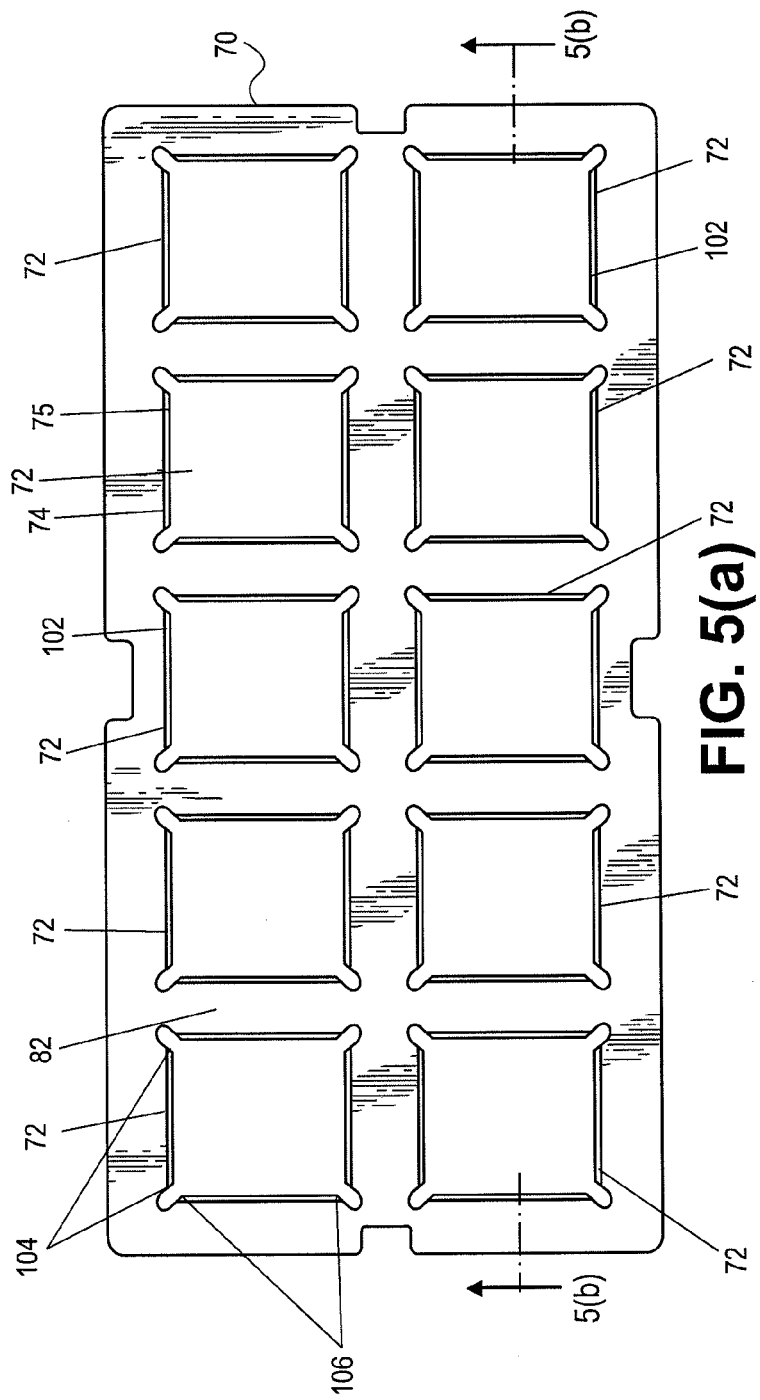
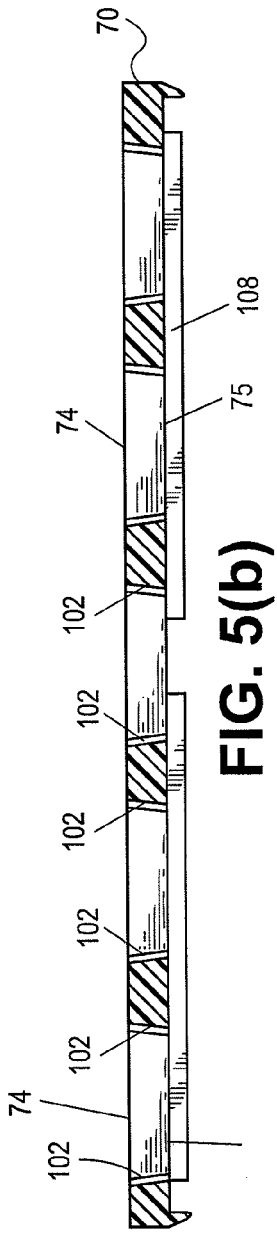

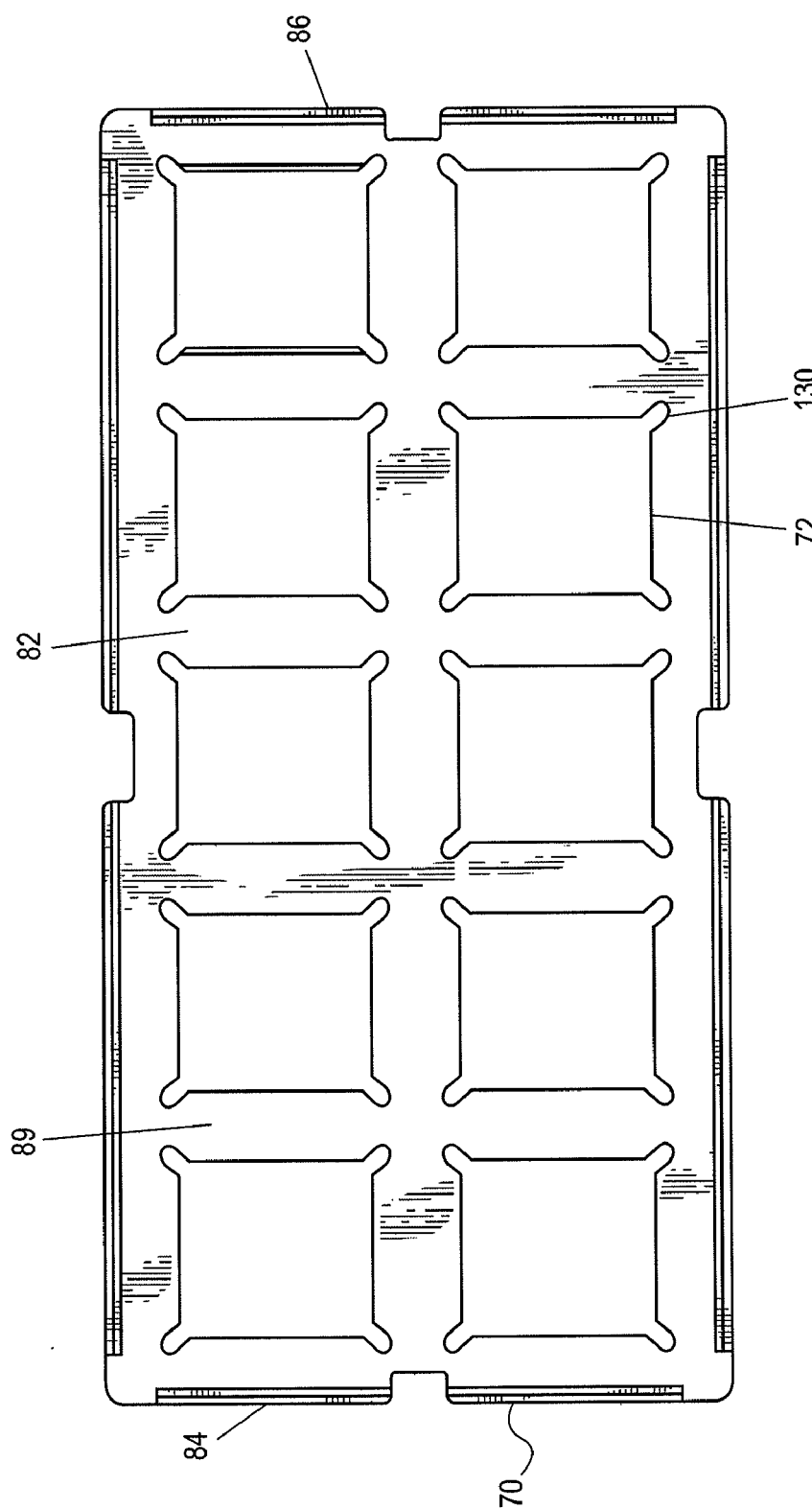

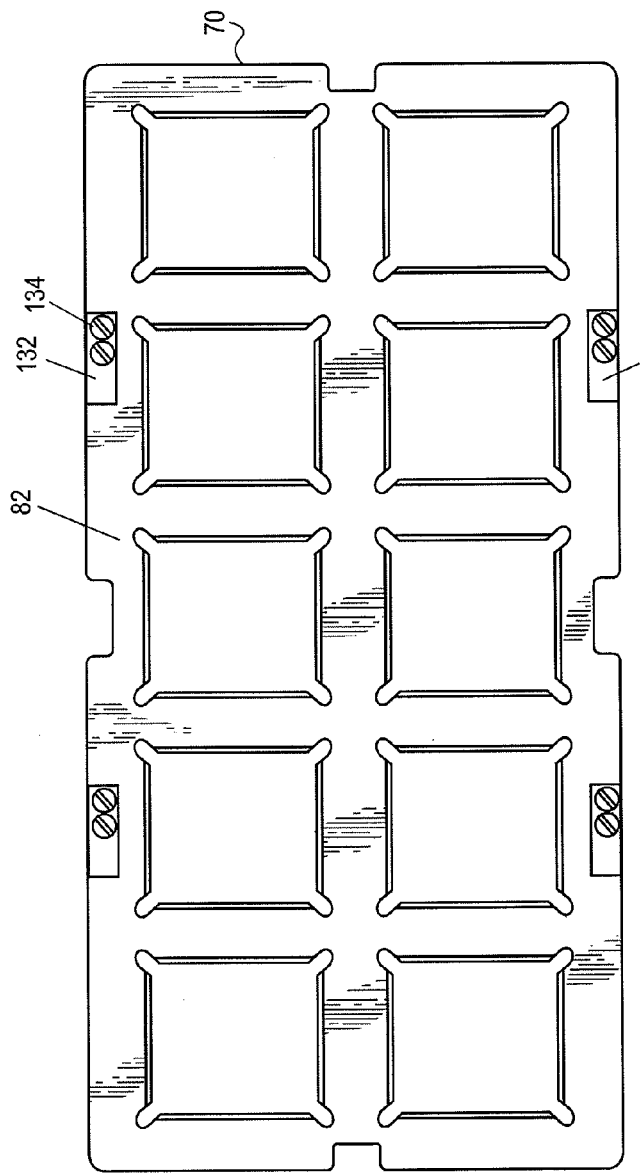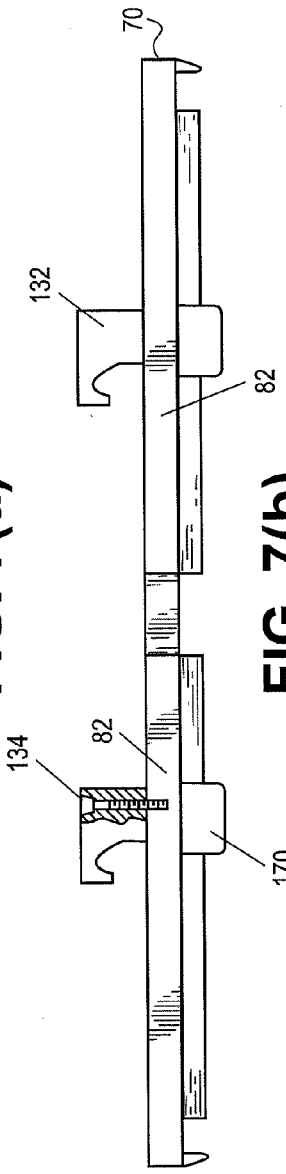
FIG. 7(a)
FIG. 7(b)

FUNNEL PLATE

FIELD OF THE INVENTION

This invention relates to a precision alignment apparatus for use in material handling systems. More specifically, the invention relates to a funnel plate and method of use thereof which facilitates transfer of components from a first tray to a second tray assisting in the packaging, shipping, or assembly of electronic components.

BACKGROUND OF THE INVENTION

Packaged semiconductor devices are currently handled and shipped in a variety of media. The predominant shipping medium for devices such as packages including those with a large numbers of leads or fragile leads is a tray composed of a support plate and a matrix of cells. Each cell is intended to contain one semiconductor device. In a typical handling procedure, shipping trays containing devices within the cells are stacked on top of each other with the top tray being empty and serving only as a lid. Many current configurations of semiconductor device packages are commonly handled and shipped in matrix trays. Examples of these packages commonly processed and shipped in trays include array package types and leaded package types. Array package types include ball grid array (BGA), quad flat package-no lead (QFN), and a pin grid array (PGA). Leaded package types include metric quad flat package (MQFP), thin quad flat package (LQFP), very thin quad flat package (TQFP), thin small outline package type I (TSOP-I), thin small outline package type II (TSOP-II), bumpered quad flat package (B/PQFP), and plastic leaded chip carrier (PLCC). Many trays have been standardized in the semiconductor industry, such as those know as JEDEC trays.

Although most trays have been standardized, numerous handling problems still exist with the use of currently available trays. A primary problem with existing trays is that they must be accurately loaded with the component in order function normally during processing/handling and shipping. Improperly loaded trays can cause poor mating between trays causing device damage during tray stacking, lack of adequate segmentation between cells which allows one device to migrate to an adjacent cell and damage the neighboring device, and insufficient device retention features in each cell allowing devices to break or override the retention features. These problems may be compounded in assembly/test development factories where material handling systems transfer large quantities of components from a matrix tray onto a pallet, and then back onto the matrix tray for further manufacturing and/or shipping steps.

Modern assembly lines use a variety of material handling systems or product transfer modules which have been designed to accurately transfer material to precise locations on the tray or substrate; however such transfer systems are highly complex and may require post-placement inspection to detect defects, misalignments, or components placed outside a predetermined tolerance. In-tray visual inspection and complex electrical tests to ensure accuracy are problematic in that they require advanced electronic equipment and software.

Other apparatuses have been designed to eliminate problems associated with misaligned components in the tray. For example, U.S. Pat. No. 5,492,223 relates to a tray for handling a semiconductor device encapsulated in a package having cell-to-cell interlocking capability. An interlocking nest feature is formed on the underside of the tray and interfaces with the cells on the topside of the tray when the trays are stacked. The interlocking nest feature has an external chamfer which mates with a lead-in chamfer of the tray cell to align the interlocking feature and the cell. The interlocking nest feature has an internal device retaining chamfer and a device capture surface to guide and retain the semiconductor device when stacking trays, inverting trays or processing semiconductor devices with the trays inverted. In-tray inspection and electrical test are also possible using a test contactor having a functional equivalent of the interlocking nest feature. However, this apparatus does not solve the problem of precisely loading the matrix tray in the first instance.

Accordingly there is a need to solve the problems associated with precision placement of parts especially during high volume assembly, quality control, and shipping of semiconductor components. Furthermore, there is a need to improve state-of-the art material transfer handling systems by reducing the necessity for high precision electronics, and precision programming necessary to operate the equipment. Thus, it is desirable to have a device which addresses all of the aforementioned problems and limitations found in the current material handling systems.

SUMMARY OF THE INVENTION

It is an object of the present invention to facilitate the transfer of electronic components from a first tray or substrate to a second tray or substrate.

It is the object of the present invention to reduce the necessity of high precision computers and software during the transfer of components through the manufacturing and shipping processes.

It is an object of the present invention to reduce the necessity of visual inspection devices after material transfer.

Still another object of the present invention is to provide a method and system for transferring components continuously and automatically, thereby minimizing complex electronic handling, to facilitate manufacture of articles, such as electronic components, at reduced cost and increased speed of manufacture.

Another object of the present invention is to increase placement accuracy of components in assembly lines of electronic equipment.

It is the object of the present invention to improve state-of-the-art material handling systems.

These and other objectives of the present invention are met by providing a device for a material handling system comprising: a plate having a first surface, a second surface, and at least one aperture extending through said plate from a first hole in the first surface to a second hole in the second surface, wherein the first hole is larger than the second hole. Preferably, the aperture further comprises at least one beveled side extending from the first hole to the second hole. Optionally, a plurality of apertures extend through said plate, which is preferably a solid plate. Preferably, the first hole and the second hole are shaped in substantially the same geometric shape. Preferably, the first hole and the second hole are concentric. Optionally, the first hole and the second hole are substantially square shaped. Preferably, ten apertures are placed in a predetermined position and extend through said plate. Preferably, the plate further comprises at least one flange positioned adjacent to the edge of said plate such that the plate may be keyed to a tray. Preferably, the tray is a JEDEC tray. Optionally, the plate further comprises at least one clip for moving said plate. Preferably, the aperture comprises at least one beveled side on an angle within the range of from about 3 to about 80 degrees from a vertical axis. Optionally, the aperture comprises at least one beveled side on an angle of approximately 10 degrees off the vertical axis. Preferably, the aperture comprises at least one smooth beveled side. Preferably, the plate comprises a longitudinally extending body having a first end and a second end, wherein the first surface is a longitudinally extending upper surface and the second surface is a longitudinally extending lower surface, the upper surface including a first flat portion, the lower surface having a second flat portion generally parallel to the first flat portion. Preferably, the plate comprises a longitudinal center axis extending through the first flat portion from the first end to the second end, wherein a plurality of apertures positioned on both sides of the axis. Preferably, a plurality of apertures are positioned on either side of the axis. Preferably, a plurality of apertures are positioned in predetermined equidistant positions from the axis. Preferably, the aperture further comprises four beveled sides. Preferably, each of the four beveled sides are smooth and comprise an angle of between about 3 to about 30 degrees off the vertical axis. Preferably, the first hole is the top hole.

Still yet, the objectives of the present invention are met by providing a process of manipulating components comprising transferring a component from a first substrate to a second substrate through a plate comprising a first surface, a second surface, and at least one aperture extending through the plate from a first hole in the first surface to a second hole in the second surface, wherein the first hole is larger than the second hole. Preferably, the aperture further comprises at least one beveled side extending from the first hole to the second hole. Optionally, a plurality of apertures extend through the plate, which is preferably a solid plate. Preferably, the first hole and the second hole are shaped in substantially the same geometric shape. Preferably, the first hole and the second hole are concentric. Optionally, the first hole and the second hole are substantially square shaped. Preferably, ten apertures are placed in a predetermined position and extend through said plate. Preferably, the plate further comprises at least one flange positioned adjacent to the edge of said plate such that the plate may be keyed to a tray. Preferably, the tray is a JEDEC tray. Optionally, the plate further comprises at least one clip for moving said plate. Preferably, the aperture comprises at least one beveled side on an angle within the range of from about 3 to about 80 degrees off the vertical axis. Optionally, the aperture comprises at least one beveled side on an angle of approximately 10 degrees off the vertical axis. Preferably, the aperture comprises at least one smooth beveled side. Preferably, the plate comprises a longitudinally extending body having a first end and a second end, wherein the first surface is a longitudinally extending upper surface and the second surface is a longitudinally extending lower surface, the upper surface including a first flat portion, the lower surface having a second flat portion generally parallel to the first flat portion. Preferably, the plate comprises a longitudinal center axis extending through the first flat portion from the first end to the second end, wherein a plurality of apertures positioned on both sides of the axis. Preferably, a plurality of apertures positioned on either side of the axis. Preferably, a plurality of apertures are positioned in predetermined equidistant positions from the longitudinal center axis. Preferably, the aperture further comprises four beveled sides. Preferably, each of the four beveled sides are smooth and comprise an angle of between about 3 to about 30 degrees off the vertical axis. Preferably, the first hole is the top hole.

In accordance with any embodiment of the present invention, a system for loading electronic packages into a tray comprises: a first loader station to load a first tray into the system; a second loader station to load a pallet into the system, the pallet having electronic packages disposed thereon; a funnel station coupled to the first loader station and the second loader station to funnel electronic packages, wherein the funnel station further comprises at least one funnel plate comprising a first surface, a second surface, and at least one aperture extending through the plate from a first hole in the first surface to a second hole in the second surface, wherein the first hole is larger than the second hole; and a transfer head comprising at least one lifter for transferring the electronic packages from the pallet to the first substrate through the funnel plate. Preferably, the system further comprises a first actuator coupled to the first substrate tray. Preferably, the system further comprises a second actuator coupled to the funnel station, the second actuator to raise and lower at least one funnel plate. Preferably, the system further comprises a third actuator coupled to the second loader station, the third actuator to feed and remove the pallet from the system. Preferably, the system further comprises a fourth actuator coupled to said transfer head, the fourth actuator for raising and lowering the transfer head and at least one lifter. Preferably, the system comprises a plurality of lifters. Preferably, the transfer head is positioned below the funnel station, however, may optionally be placed above.

As used herein the term "beveled" means an angled part or surface wherein the angle is other than a right angle. The term also means to impart a sloping edge to or have a sloping edge or slant. The term also means a sloping curved or rounded edge, the rounded edge being concave or convex. The term also means an arc shaped surface.

BRIEF DESCRIPTION OF THE DRAWINGS

FIG. 5(a) is a top plan view of the funnel plate device of FIG. 2, and FIG. 5(b) is a side cross sectional view thereof;

FIGS. 6 is a bottom plan view of a funnel plate assembly of FIG. 2;

FIGS. 7(a) is a top plan view of a funnel plate assembly with clip and flange, and FIG. 7(b) is a side plan view of the same embodiment;

DETAILED DESCRIPTION OF THE DRAWINGS

Figure 1:
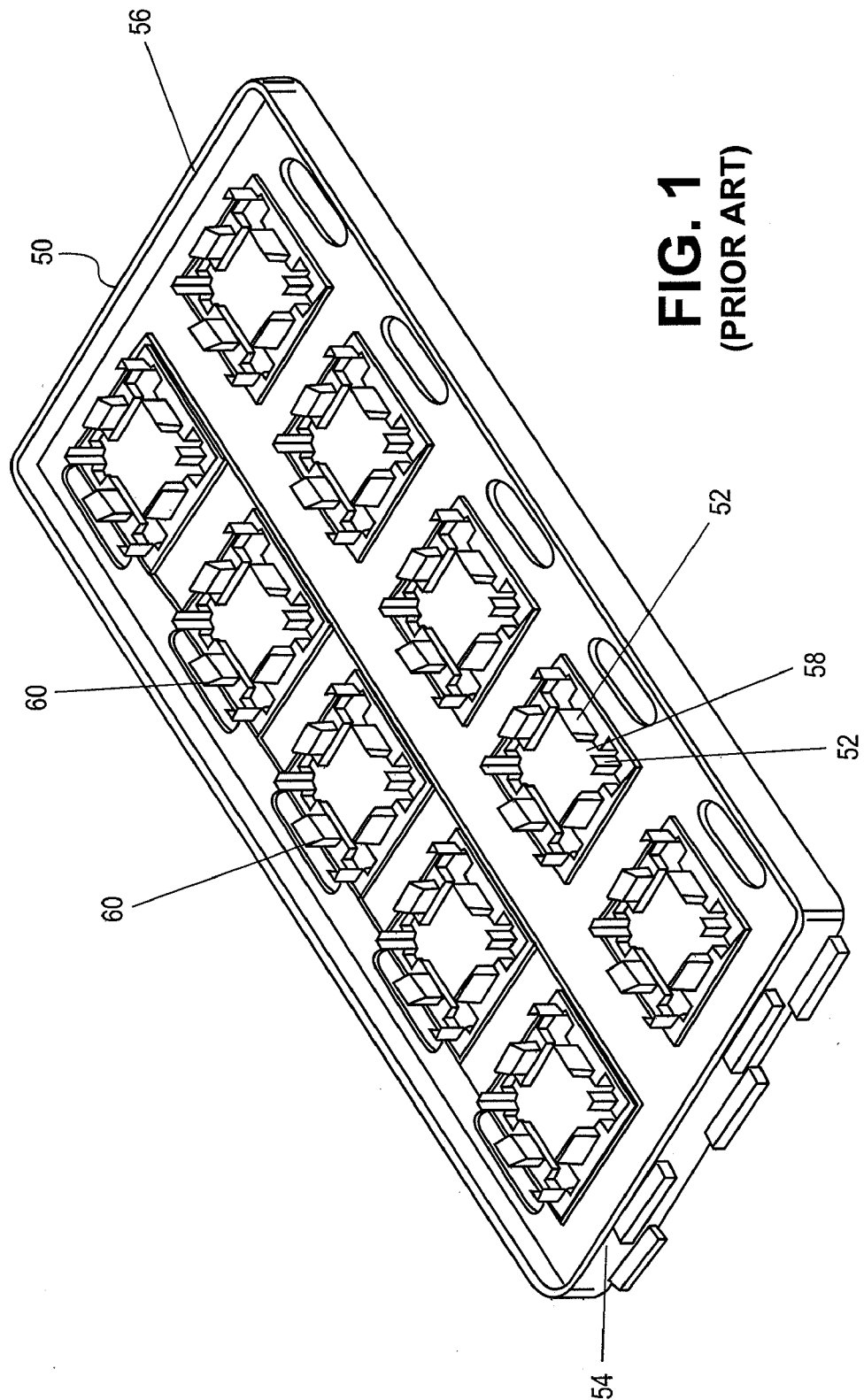
FIG. 1 is a front isometric view of a JEDEC tray.

FIG. 1 shows a typical tray (50) used in the semiconductor industry to hold electronic packages. Tray (50) may be a standardized Jedec tray and may be made of any material one of ordinary skill in the art would use to make a tray. Tray (50) has a first end (54) and a second end (56). At least one orifice (58) is positioned in tray (50) as a receptacle for at least one electronic package. Typically, orifice (58) is surrounded by indentations, ridges, or bumps (52) to assure the position of electronic package or component. At least one opening (60) may be positioned around the side of tray (50) in order to facilitate the stacking of tray (50) either on top or bottom of another tray (50), or to facilitate keying tray (50) to another component such as a funnel plate (not shown in FIG.1). Opening (60) may be in the shape of an oval or circle, or the like.

For packaging operations and electronic package transfer where precision is a necessity, the position of the electronic packages within tray (50) is crucial. Due to the indentations, ridges, or bumps (52) used for aligning the electronic packages within tray (50), occasionally, some electronic packages are placed in the tray in such a way that they do not get seated properly within the indentations, ridges, or bumps (52). When this occurs, the electronic packages can lie at an angle with respect to tray (50).

Since the packaging or transfer process is typically entirely machine driven, both for increased speed and accuracy purposes, a misaligned electronic package may result in a packaged product that does not work properly or worse, it may cause the packaging process to be halted to allow human intervention to fix the alignment problem. Therefore, it is desirable to minimize the occurrence of misaligned electronic packages.

Figure 2:
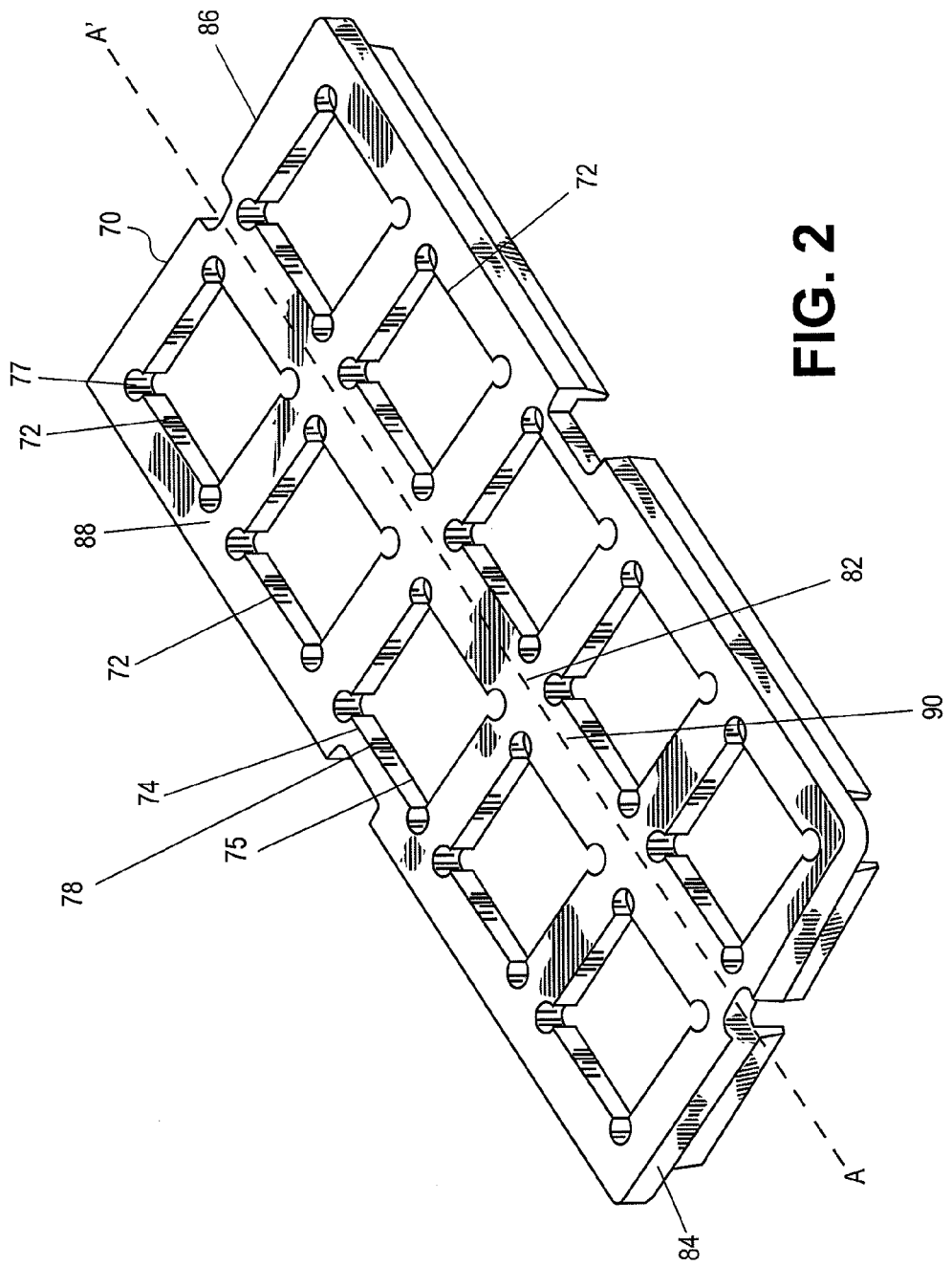
FIG. 2 is front isometric view of a funnel plate assembly in accordance with the present invention.

Referring now to FIG. 2, an isometric view of funnel plate (70) of the present invention is shown. Funnel plate (70) may be made of any material that one of ordinary skill in the art would use to make a plate such as plastic, thermoplastic, metal, aluminum, steel, iron, graphite, and the like, and combinations thereof. Funnel plate (70) has a predetermined length, and a predetermined first width, and is typically manufactured into a solid embodiment. Funnel plate device (70) has a longitudinally extending body (82) having a first end (84) and a second end (86), body (82) having an upper surface (88) and a lower surface (not shown in FIG. 2), upper surface (88) including a first flat portion (90), the lower surface (not shown in FIG. 2) having a second flat portion (not shown in FIG. 2) generally parallel to first flat portion (90). At least one aperture (72) is shown extending through funnel plate (70). Aperture (72) comprises first opening (74), a second opening (75) and at least one beveled side (78) such that first opening (74) is a different size than second opening (75). Preferably, first opening (74) is larger than second opening (75). FIG. 2 shows a plurality of apertures (72) extending through funnel plate (70). Aperture (72) also has exaggerated corner (77) extending through funnel plate (70) from first opening (74) to second opening (75). Exaggerated corner (77) facilitates the proper seating of funnel plate (70) to a tray, such as tray (50).

Still referring to FIG. 2, a longitudinal center axis (A-A') extends through body (82) through first flat portion (90) from first end (84) to second end (86). A plurality of apertures (72) are positioned on both sides of axis A-A'. Such apertures (72) may be positioned on either side of the axis, or in predetermined equidistant positions from the axis.

Figure 3:
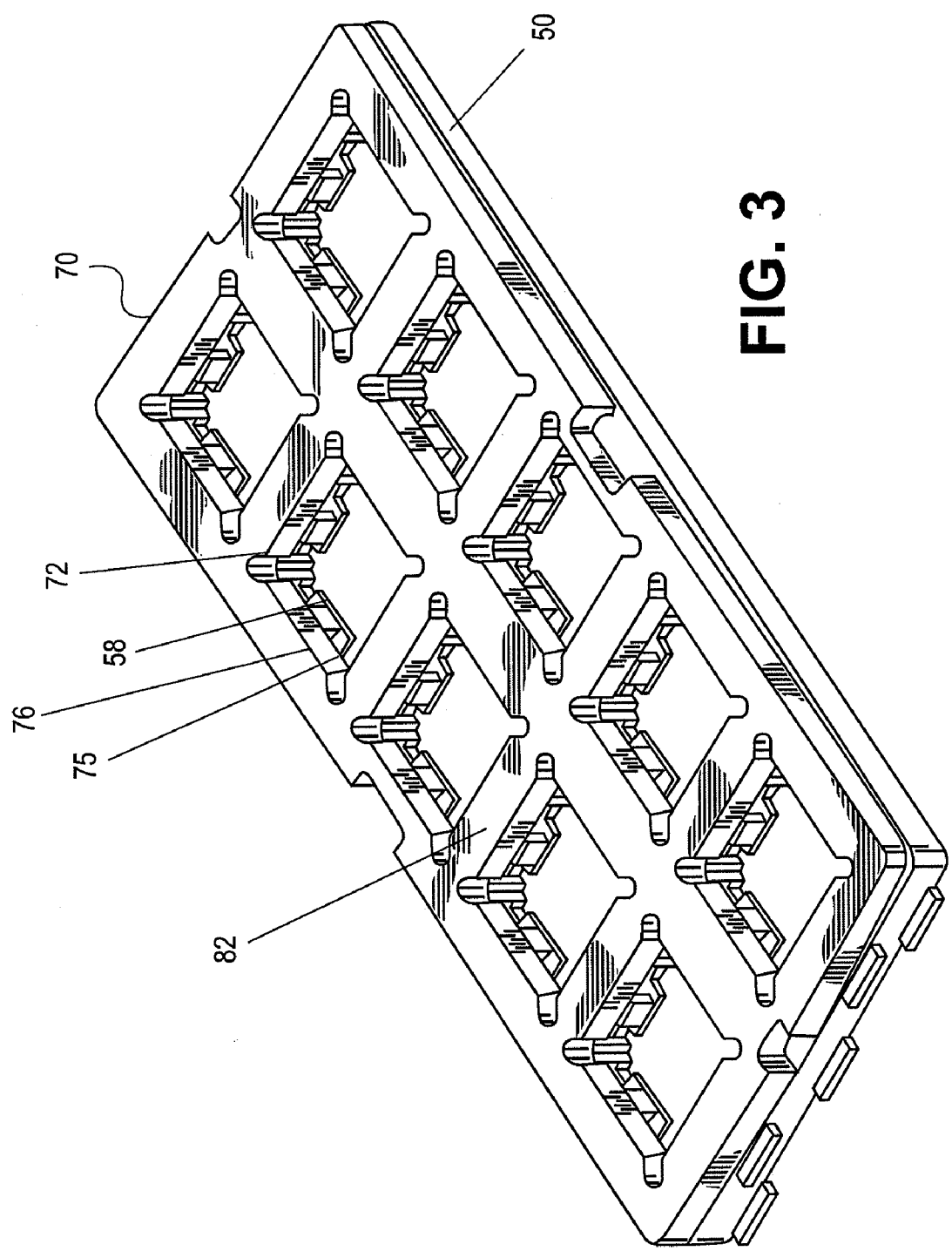
FIG. 3 is a front isometric view of a funnel plate assembly of FIG. 2 placed upon the tray shown in FIG. 1.

Referring now to FIG. 3, an isometric view of funnel plate (70) of the present invention is shown, stacked on top of tray (50). Of particular importance to the present invention is creating continuity between funnel plate (70) and tray (50). Since tray (50) may have a plurality of orifices (58) on tray (50), and orifice (58) may change size depending on the electronic package it is supposed to hold, it is necessary to manufacture funnel plate (70) in such a way that it can be matched to tray (50). In particular, second opening (75) must be precisely sized and shaped so that it can be accurately aligned with orifice (58). Second opening (75) is of a predetermined dimension such that electrical component barely fits through it. Aperture (72) is shown immediately adjacent to orifice (58). Funnel plate (70) is placed on top of tray (50) such that second opening (75) is immediately adjacent to orifice (58). Body (82) is shaped in such a way that it essentially keys into tray (50). At least one flange (not shown in FIG. 3) may facilitate keying.

Figure 4:
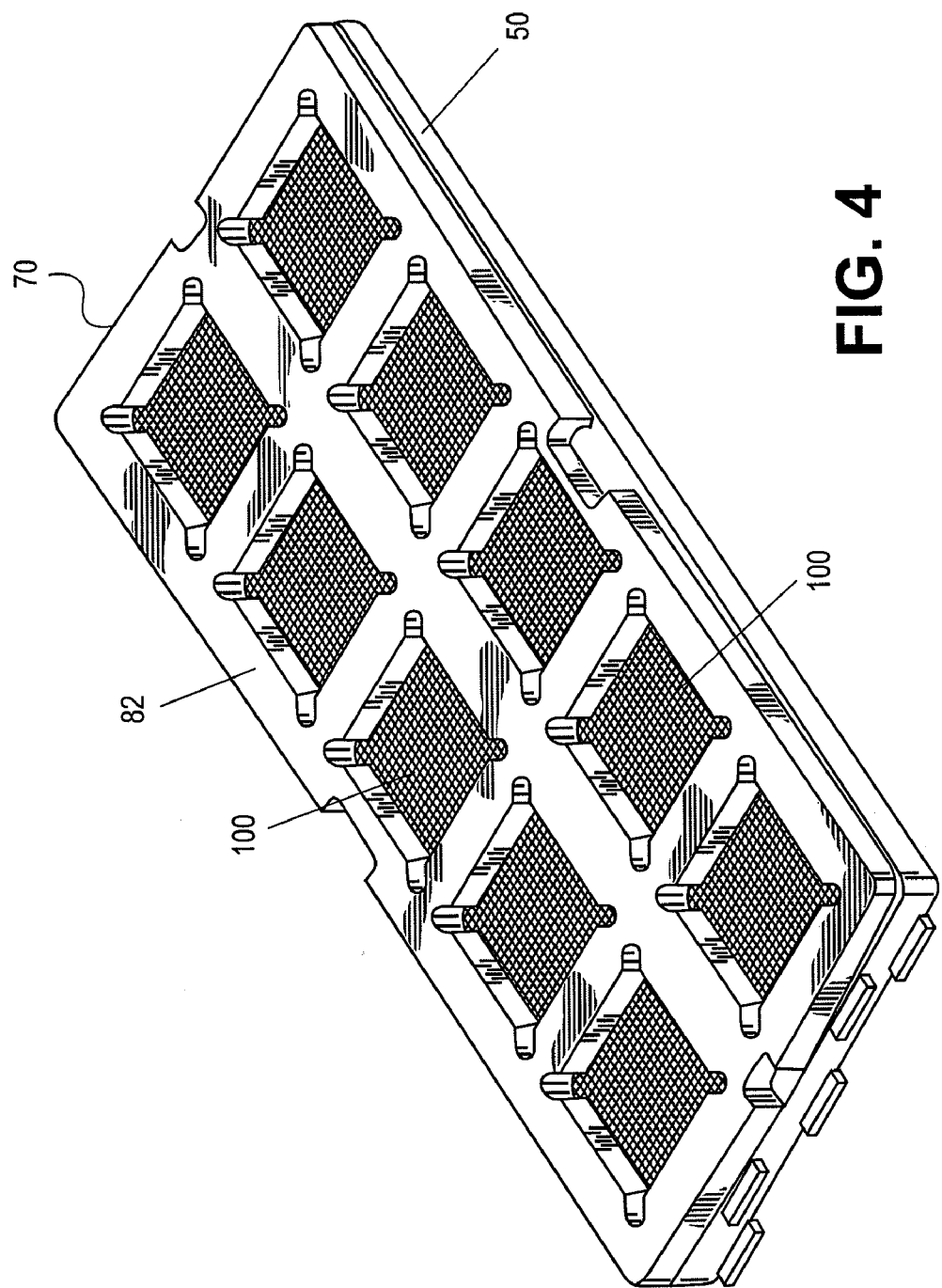
FIG. 4 is a front isometric view of a funnel plate assembly of FIG. 2 placed upon the tray shown in FIG. 1, further showing a substrate placed onto the tray.

Referring now to FIG. 4, an isometric view of funnel plate (70) of the present invention is shown, stacked on top of tray (50). Electronic package or substrate or electronic component (100) is shown positioned and held by tray (50) in orifice (58). Electronic package (100) may be any electronic package that is normally held by a tray (50) such as a Jedec tray. Accordingly, electronic package (100) may be selected from array package types include ball grid array (BGA), quad flat package-no lead (QFN), pin grid array (PGA) and combinations thereof. Electronic package may also include leaded package types such as metric quad flat package (MQFP), thin quad flat package (LQFP), very thin quad flat package (TQFP), thin small outline package type I (TSOP-I), thin small outline package type II (TSOP-II), bumpered quad flat package (B/PQFP), plastic leaded chip carrier (PLCC) and combinations of these. Moreover, electronic package (100) may be any component used to make any of the above-mentioned electronic packages and the like.

Referring now to FIG. 5(a) a top plan view of the funnel plate device (70) in accord with the present invention is shown. Funnel plate (70) is depicted having a plurality of apertures (72) placed in predetermined position through body (82). In this preferred embodiment, ten apertures (72) are evenly distributed between two rows and five columns. However, such a distribution is not necessary. Other embodiments may place apertures (72) in any variety of columns and rows, so long as the columns and rows are positioned to deliver a plurality of electronic packages (100) to a tray such as tray (50). For example, other such embodiments may have between 1 to 50 rows of apertures (72) in combination with between 1 to 50 columns of apertures (72) on a single funnel plate. Accordingly, various embodiments of the present invention include body (82) having 1 row of 5 apertures (72), 3 rows of 5 apertures (72) in 5 columns, 4 rows of 5 apertures (72) in five columns, 5 rows of 5 apertures (72), in 5 columns, 1 row of 6 apertures (72) in 6 columns, 2 rows of 6 apertures (72) in 6 columns, 4 rows of 6 apertures (72) in 6 columns, etc. This list is not exhaustive and any combination of rows and columns of aperture (72) may be pre-selected. Preferably the number of columns and rows, along with the shape of the aperture is pre-selected in order to promote a match between aperture (72) position in body (82) with a tray such as tray (50). Such a match will promote high volume accurate transfer of electronic components to a tray.

Still referring to FIG. 5(a) aperture (72) is shown having at least one beveled side (102). Beveled side (102) is positioned between first opening (74) and second opening (75). Preferably beveled side (102) is smooth and on an angle in order to funnel electronic component (100) (not shown in FIG. 5A) through funnel plate (70). Also shown is aperture (72) having a first length (104) and a first width (106). In one preferred embodiment aperture (72) is substantially square such that first length (104) and a first width (106) are substantially equal. In other embodiments, first length (104) and first width (106) may be different lengths forming aperture (72) in a geometric shape other than a square such as a rectangle. In preferred embodiments, first length (104) and first width (106) may be: 42.5 mm×42.5 mm, 37.5 mm×40 mm, 37.5 mm×37.5 mm, 34 mm×34 mm, 31 mm×31 mm, 27 mm×27 mm, 19.5 mm×24.5 mm, 17 mm×17 mm. However, other embodiments run the gamut between having a first length (104) between the range of 3 mm to 10,000 mm in combination of a first width (106) between the range of 3 mm to 10,000 mm. Any such combination is possible so long as the dimensions are selected such that the size of aperture (72) is very closely sized to the component (100) (not shown in FIG. 5A) so that the component barely fits through. Such sizing is important in order to obtain corrective measures. Moreover, the dimensions are pre-selected to promote a match between aperture (72) position in body (82) with a tray such as tray (50) and the orifices (58) therein. Such a pre-selection or match will promote high volume accurate transfer of electronic components to a tray.

Referring now to FIG. 5(b) a cross-sectional view of funnel plate device (70) in accord with the present invention is shown. Beveled side (102) is positioned between first opening (74) and second opening (75). First opening (74) is larger than second opening (75) because beveled side (102) slopes in the direction of the second opening (75). In one preferred embodiment, first opening (74) and second opening (75) share the same center, such that if the openings were substantially square shaped, the squares are best characterized as concentric. Preferably, beveled side (102) is smooth and on an angle in order to funnel electronic component (100) (not shown in FIG. 5(b)) through funnel plate (70). Beveled side (102) is a straight slope without any bumps are ridges so that it does not misalign an electronic component passed between first opening (74) and second opening (75). Also shown is a lower side wall (108) which extends longitudinally along the side of funnel plate (70).

Figure 5C:
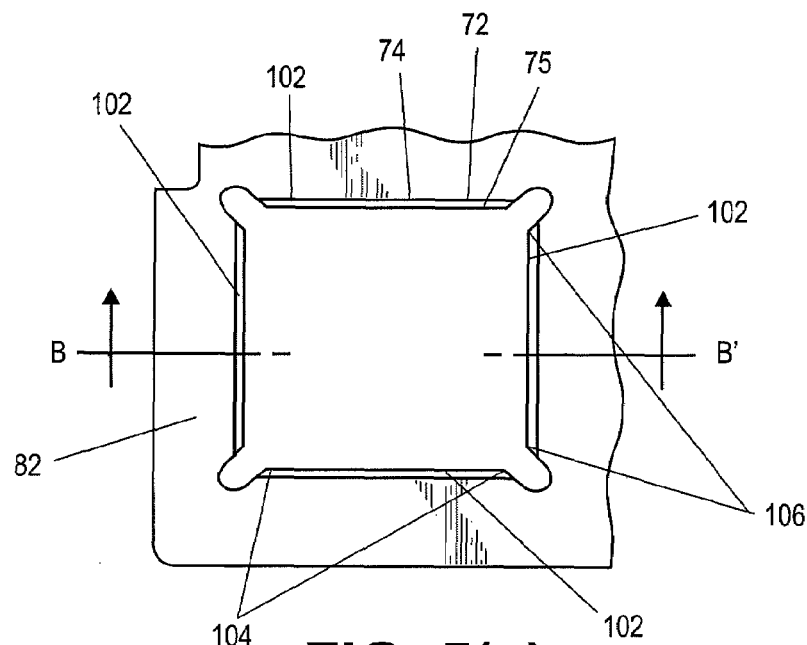
FIG. 5(c) is a top plan view of the funnel plate aperture of FIG. 2.

Referring now to FIG. 5(c) aperture (72) is shown having at least one beveled side (102). In a preferred embodiment four beveled sides (102) are positioned between first opening (74) and second opening (75). Preferably beveled side (102) is smooth and on an angle in order to funnel electronic component (100) (not shown in FIG. 5(c)) through funnel plate (70). Optionally beveled side (102) may be arch-shaped, curved, or slightly rounded, so long as it slopes inward and is shaped such that it can provide corrective measures to a misaligned component (100) (not shown in FIG. 5(c)).

Figure 5D:
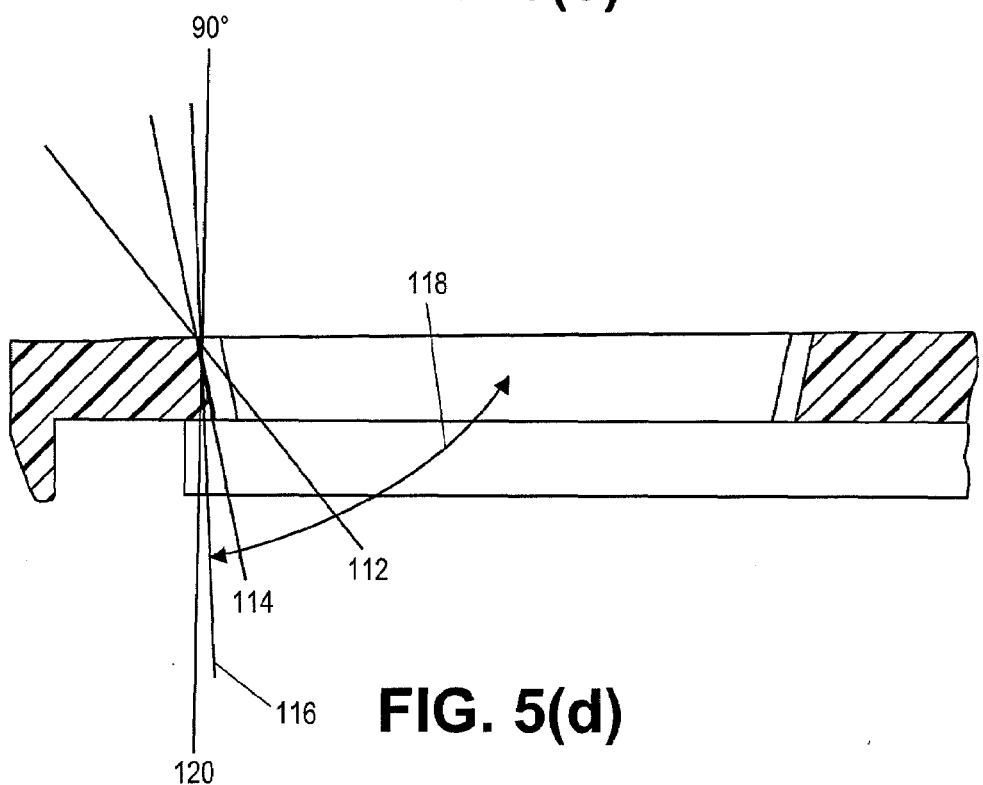
FIG. 5(d) is a side cross sectional view thereof.

FIG. 5(d) is a cross-sectional view of the aperture of FIG. 5(c) along axis B-B'. Although any angle can be used that accurately directs the electronic package to the tray below, FIG. 5(d) shows multiple preferred embodiments. In the most preferred embodiment, the angle or slope is approximately 20 degrees off of the vertical axis (120). This angle is represented by the slope of the line (112) in comparison to the 90 degree axis (120) in FIG. 5(d). In other preferred embodiments, the angle or slope is approximately 10 degrees off of the vertical axis. This angle is represented by the slope of the line (114) in comparison to the 90 degree axis (120) in FIG. 5(d). Still yet, other preferred embodiments use a very steep slope such that the angle or slope is approximately 3 degrees off of the vertical axis. This angle is represented by the slope of the line (116) in comparison to the 90 degree axis (120) in FIG. 5(d). However, any angle between 3 degrees and 80 degrees off the vertical axis (120) that promotes the accurate direction of the electronic package into the tray below is suitable. Such embodiments are represented by arrow (118) in FIG. 5(d).

Figure 5E:
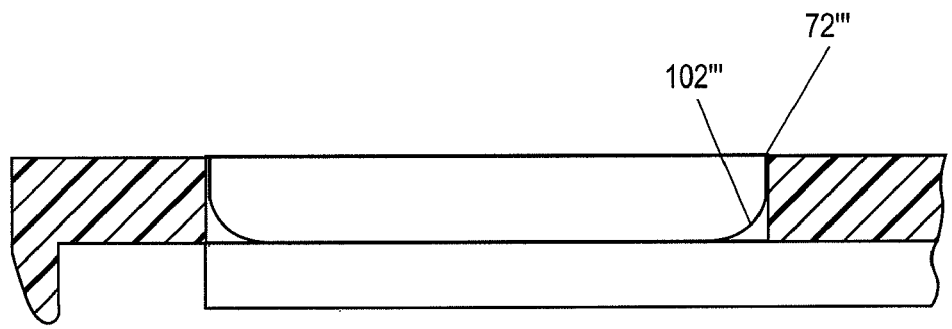
FIG. 5(e) is a cross sectional view of another beveled side embodiment.

FIG. 5(e) is a cross-sectional view of an aperture of another embodiment of the present invention along a similar axis B-B'. Beveled side 102''' is shown in the shape of an arc, where its center portion is curving towards the outer edge of aperture (72'''). Here the arc shaped side is smooth and able to accurately direct a misaligned electronic package into a desired location.

Figure 5F:
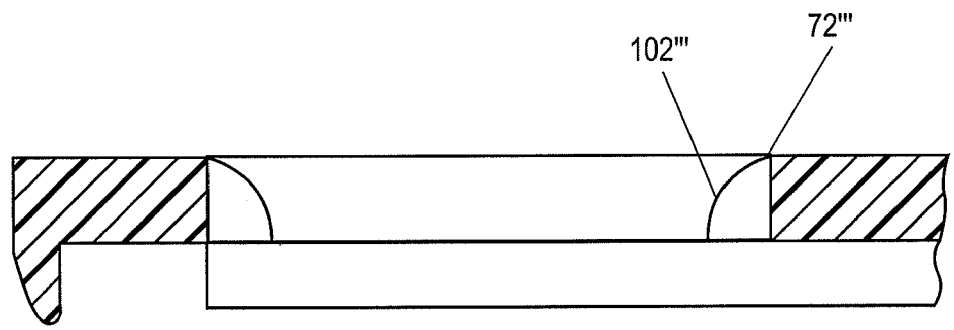
FIG. 5(f) is a cross sectional view showing a third beveled side embodiment.

FIG. 5(f) is a cross-sectional view of an aperture of another embodiment of the present invention along a similar axis B-B'. Beveled side 102''' is shown in the shape of an arc, where its center portion is curving away from the outer edge of aperture (72'''). Accordingly, its center portion is curving towards the center of the aperture (72'''). Here the arc shaped side is smooth and able to accurately direct a misaligned electronic package into a desired location.

Referring now to FIG. 6, a bottom plan view of funnel plate (70) is shown. Funnel plate device (70) is shown having a longitudinally extending body (82) having a first end (84) and a second end (86), body (82) having an upper surface (not shown in FIG. 7) and a lower surface (89), generally parallel to upper surface. Also shown is at least one exaggerated rounded corner (130) of aperture (72).

Referring now to FIG. 7(a), a top plan view of funnel plate (70) with clip is shown. At least one clip (132) is connected to body (82) which is suitable for moving or manipulating plate (70) when put into lifter unit (not shown in FIG. 7(a)). Clip (132) may be connected to the plate by any method available to one of ordinary skill in the art, such as fastening with a screw, or using an adhesive. Screw (134) is preferable, since plate (70) may be subjected to stressors in lifting unit (124), such as heat and repetitive high volume usage.

Referring now to FIG. 7(b), a side plan view of funnel plate (70) with clip is shown. At least one clip (132) is connected to body (82) which is suitable for moving or manipulating plate (70) when put into lifter unit (not shown). Clip (132) may be connected to the plate by screws. Screw (134) is preferable, since plate (72) may be subjected to stressors in lifting unit (not shown in FIG. 7(b)), such as heat and repetitive high volume usage. Screw (134) should pass through the clip or flange (132) such that it enters into body (82). At least one flange (170) may be positioned around body (82) to facilitate keying to a tray.

Figure 8A:
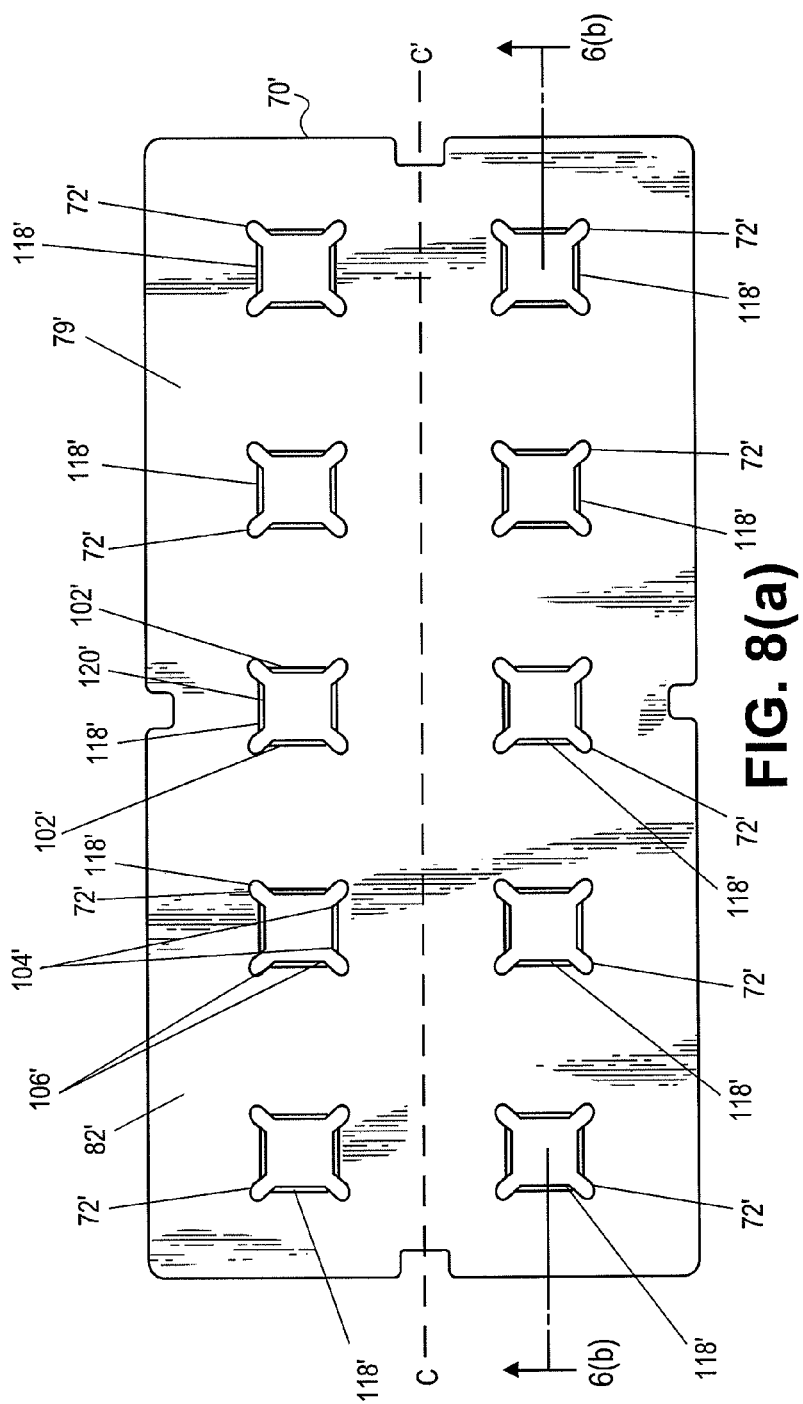
FIG. 8(a) is a top plan view a funnel plate assembly with apertures.

Referring now to FIG. 8(a) a top plan view of the funnel plate device (70') in accord with the present invention is shown. Funnel plate device (70') is preferably used in a semiconductor material handling system. Funnel plate (70') is shown having a longitudinally extending first surface (79'), a longitudinally extending second surface (not shown in FIG. 8(a)), and at least one aperture (72') extending through funnel plate (70') from a first hole (118') in first surface (79') to a second hole (120') in the second surface (83'), wherein the first hole (118') is larger than the second hole (120'). Funnel plate (70') is depicted having a plurality of apertures (72') placed in predetermined position through body (82'). Body (82') is also shown where the surface area of first surface (79') is greater than the surface area of aperture (72'). Meaning that the combined open surface area of first hole (118') is smaller than the surface area of first surface (79'). Such embodiments make body (82') bulkier. In this preferred embodiment, ten apertures (72') are evenly distributed between two rows and five columns. However, any such distribution is possible for other embodiments.

Figure 8B:
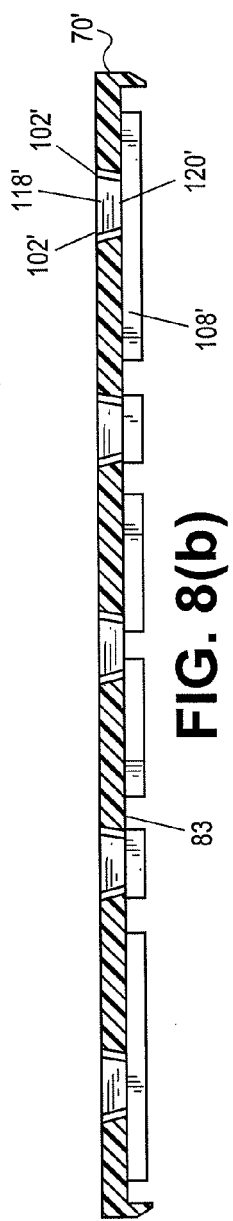
FIG. 8(b) is a side plan view of the same embodiment.

Referring now to FIG. 8(b) a cross-sectional view of funnel plate device (70') in accord with the present invention is shown along axis C-C'. Beveled sides (102') are positioned between first hole (118') and second hole (120'). First hole (118') is larger than second hole (120') because beveled sides (102') slope in the direction of the second hole (120'). In this embodiment, body (82') is also shown where the surface area of first surface (79') is greater than the area of aperture (72').

Referring now to FIGS. 9(a-f), schematic diagrams illustrate the transfer process of electronic packages (100) from a pallet (122) to a JEDEC tray such as tray (50) using a lifter unit (124). Referring to FIG. 9(a) funnel plate (70) is made of aluminum and mates precisely with tray (50). Funnel plate (70) is integral to lifter unit (124), thus no tools are required for a change over. Accordingly, changeovers may occur quickly in less than or equal to one minute time. Funnel plate (70) is shown over tray (50). Aperture (72) is clearly shown in the shape of a funnel.

Figure 9A:
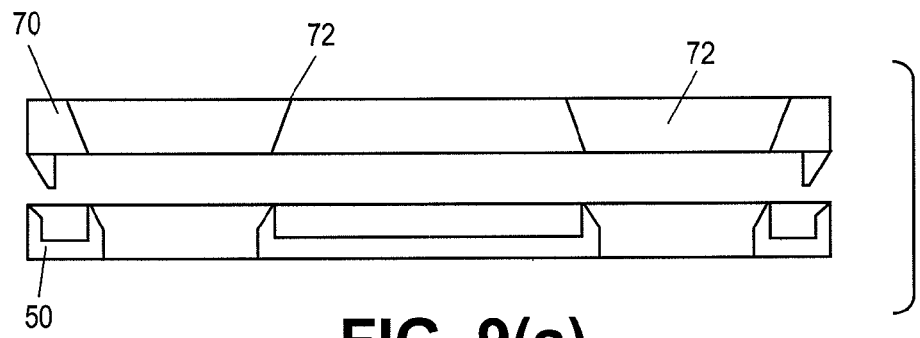
FIGS. 9(a)(b)(c)(d)(e) and (f) are schematic illustrations of a method of using a funnel plate apparatus such as that shown in FIG. 2.
Figure 9B:
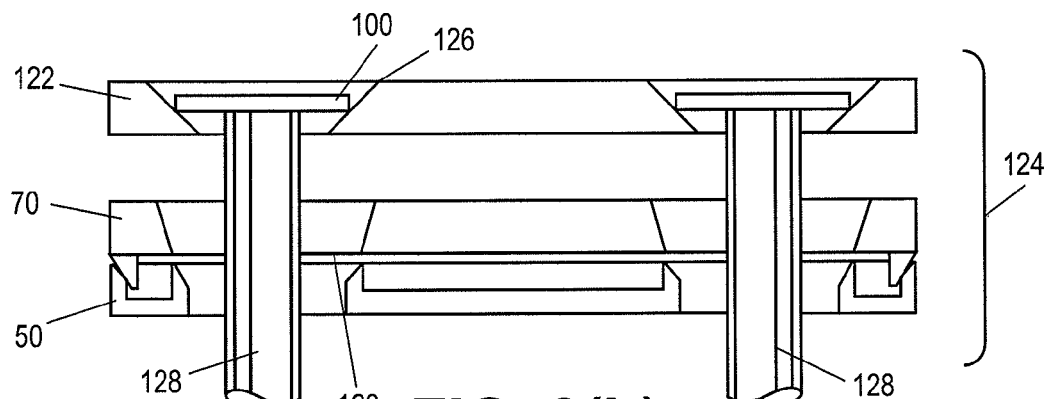

Referring now to FIG. 9(b) funnel plate (70) is shown in a schematic illustration in lifter unit (124). Pallet (122) is positioned in lifter unit (124) above funnel plate (50). Funnel plate (50) is positioned in lifter unit (124) above a JEDEC tray (50). In the beginning of the process, pallet (122) is loaded having electronic packages (100) preloaded thereon. Pallet (122) may comprise wells or holes (126) for holding electronic packages (100) in place on pallet (122). In this case, lifters (128) originating from below tray (50) extend through tray (50), through, funnel plate (70), and through pallet (122) until the lifter contact the electronic package (100). Electronic package (100) has predetermined dimensions which are highly repeatable. FIG. 7(b) shows lifter (128) in contact with electronic package (100). Funnel plate (70) is precisely mated to tray (50). The bottom opening or hole (120) is precisely matched to be a very close size, slightly larger than electronic package (100).

Figure 9C:
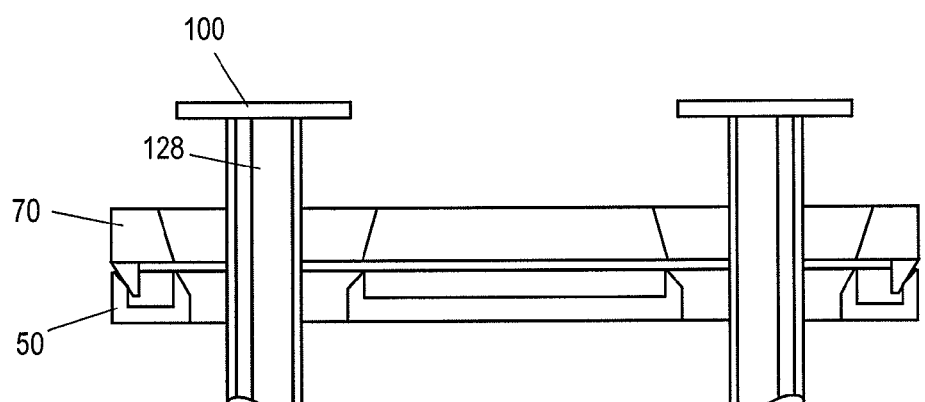

Referring now to FIG. 9(c) where pallet (122) has been transferred out and removed from the lifter unit, lifter (128) is shown holding electronic package (100) in a free state. In some embodiments, lifter (128) uses vacuum to hold electronic package (100) onto lifter (124). Funnel plate (70) is mated precisely to tray (50) which may be a JEDEC tray.

Figure 9D:
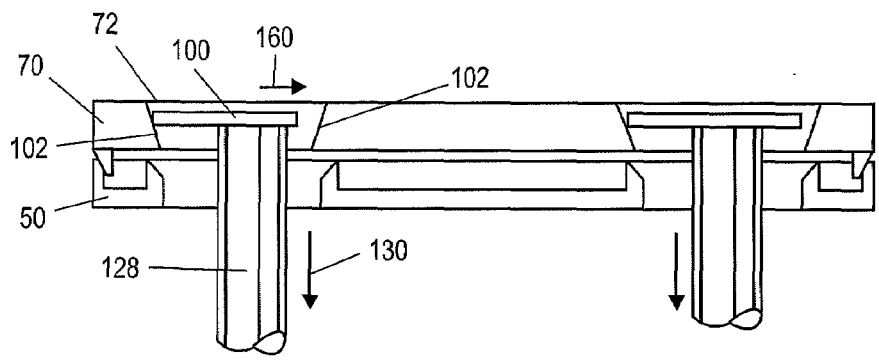

Referring now to FIG. 9(d), lifter (128) is shown by arrow (128) as moving in a downward direction, carrying electronic package (100) into aperture (72) of funnel plate (70). Misalignment of electronic component (100) is corrected by aperture (72) and its beveled walls (102). Arrow (160) shows correction of misaligned electronic package (100) in a centering direction. Arrow (160) represents the movement of electronic package (100) to the right, caused by redirection of the electronic component (100) by the left side bevel (102). Funnel plate (70) is mated precisely to tray (50) which may be a JEDEC tray.

Figure 9E:
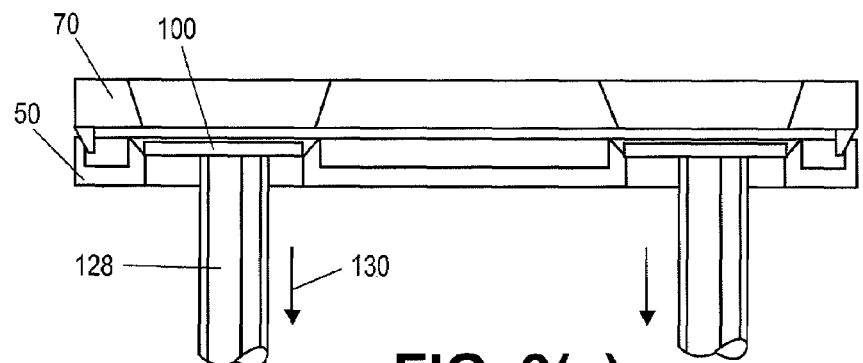

Referring now to FIG. 9(e), lifter (128) is shown by arrow (130) as moving in a downward direction, fully seating electronic package (100) precisely onto tray (50). Funnel plate (70) is mated precisely to tray (50) which may be a JEDEC tray.

Figure 9F:
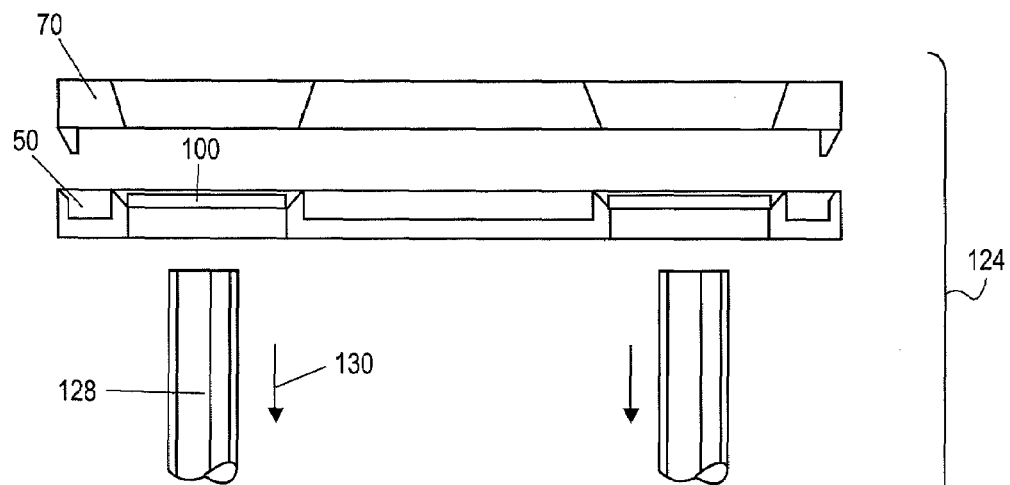

Referring now to FIG. 9(f), lifter (128) is shown by arrow (130) as moving in a downward direction, leaving electronic package (100) precisely packaged in tray (50). Funnel plate (70) may now be lifted away from tray (50) by an actuator (not shown) in lifter unit (124).

Figure 10:
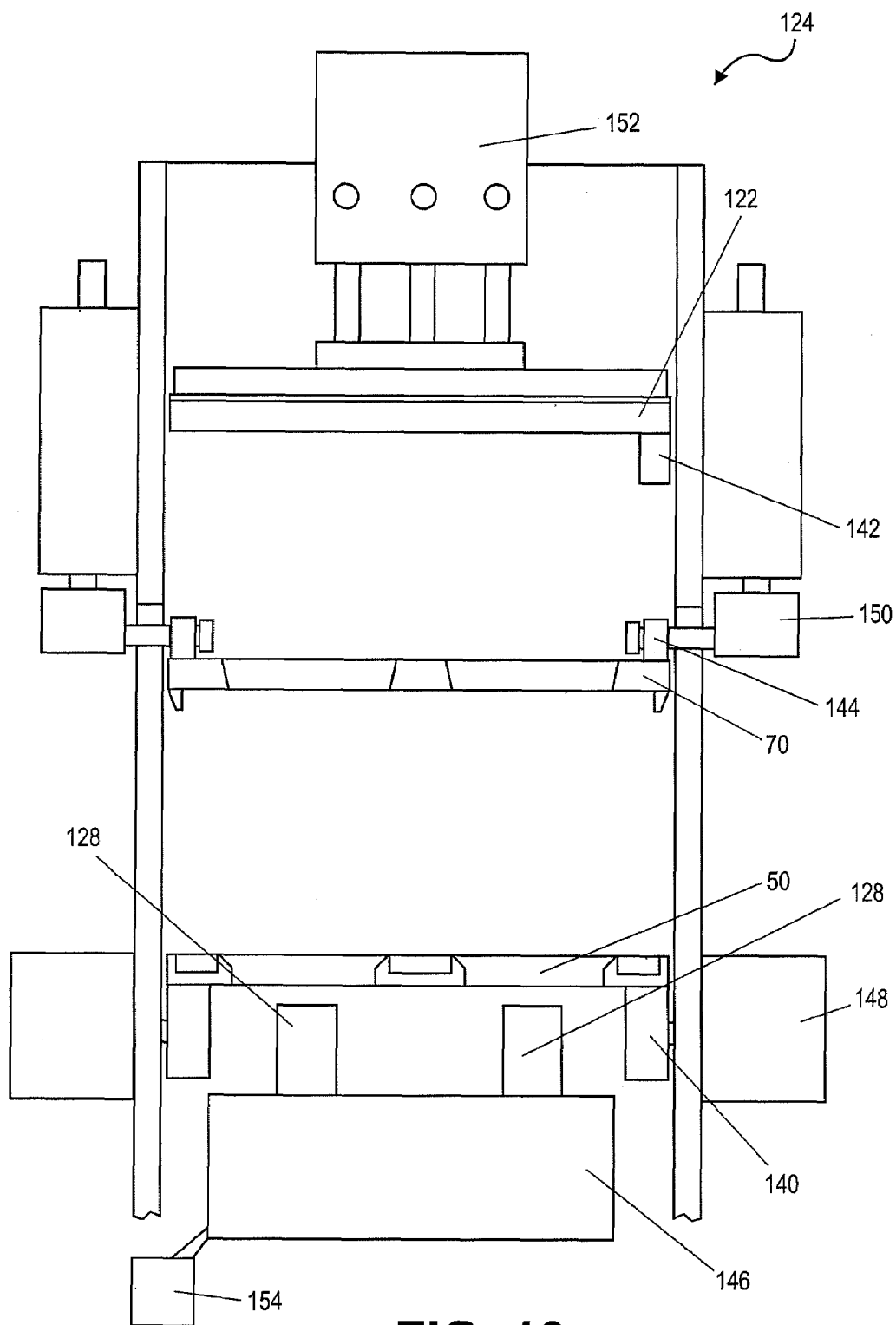
FIG. 10 is a front view of a funnel plate assembly of FIG. 2 combined with a material transfer module in accord with the present invention.

Referring now to FIG. 10, a diagram illustrates a lifter unit (124) utilizing funnel plate (70) of the preferred embodiment of the present invention. Lifter unit (124) may be any suitable material handling system adapted to hold funnel plates, such as Simplimatic Automation Model 7020 Product Transfer Module. Lifter unit (124) may be in-line and connected to inputs and outputs known in the art. Substrate tray (50) is loaded at first loader station (140). Second loader station (142) is also provided to load pallet (122) into lifter unit (124), pallet (122) having electronic packages (not shown in FIG. 10) disposed thereon. Funnel station (144) is also provided such that it is coupled to first loader station (140) and second loader station (142) to funnel electronic packages. The funnel station (144) further comprises at least one funnel plate (70) as described herein. Such funnel plate (70) may comprise a first surface, a second surface, and at least one aperture extending through the plate from a first hole in the first surface to a second hole in the second surface, wherein the first hole is larger than the second hole. Transfer head (146) is also shown comprising at least one lifter (128) for transferring the electronic packages (not shown) from pallet (122) to a first substrate (50) through the funnel plate (70). The system further comprises a first actuator (148) coupled to the first substrate tray (50) in first loader station (140). Preferably, the system further comprises a second actuator (150) coupled to a funnel station (144), second actuator (150) to raise and lower at least one funnel plate (70). Preferably, the system further comprises third actuator (152) coupled to second loader station (142), third actuator (152) to feed and remove pallet (122) from the system. Preferably, the system further comprises fourth actuator (154) coupled to transfer head (146), fourth actuator (154) for raising and lowering transfer head (146) and at least one lifter (128). Preferably, the system comprises a plurality of lifters (128). Preferably, the transfer head (146) is positioned below the funnel station.

Figure 11:
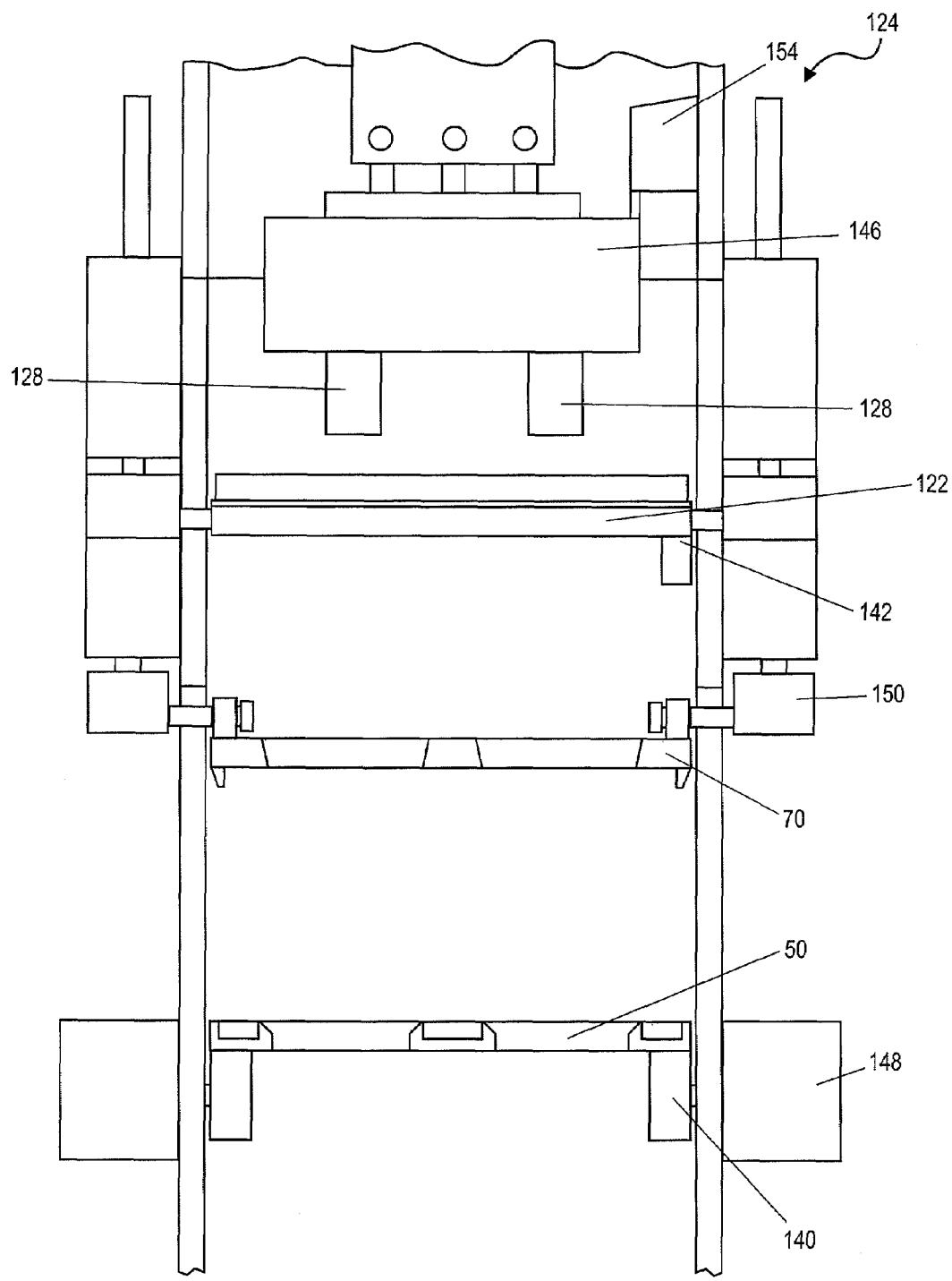
FIG. 11 is a front view of a funnel plate assembly of FIG. 2 combined with a second material transfer module in accord with the present invention.

Referring now to FIG. 11, a diagram illustrates a lifter unit (124) utilizing funnel plate (70) of the preferred embodiment of the present invention. In this preferred system, transfer head is positioned above first loading station (140), second loader station (142), and funnel station (144).

According to the preferred embodiment of the present invention, the actuators used to raise and lower the plate and lifting devices are driven by compressed air (pneumatic). Alternatively, the actuators may be hydraulic, or they may be electrical motors with fine control. Any controllable actuator type may be selected by one of ordinary skill in the art.

Although the present invention has been shown and illustrated in terms of a specific method and apparatus, it will be apparent that changes or modifications can be made without departing from the spirit and scope of the invention as defined by the appended claims.

What is claimed is:

1. A device for a material handling system comprising:
a first substrate for holding a material;
a lifter with a surface that contacts the material on the first substrate and transfers the material and the surface of the lifter through a plate;
the plate having a first end, a second end, a front side, a back side, a first surface, a second surface, and at least one aperture extending through said plate from a first hole in the first surface to a second hole in the second surface, wherein the first hole is larger than the second hole, wherein the second hole is sized to transfer the surface of the lifter and the material through the second hole, wherein the aperture is shaped to correct the alignment of the material on the surface on the lifter while maintaining the material on the surface of the lifter;
a tray keyed to the plate;
a catch extending from each of the first and second ends of the plate, wherein the catch attaches to a grooved portion of the tray;
at least one clip connected to the plate, the at least one clip having a mating portion; and a plate lifting unit which attaches to the mating portion, wherein the at least one clip enables movement of the plate when the mating portion is attached to the plate lifting unit.

2. The device of claim 1 wherein the aperture further comprises at least one beveled side extending from the first hole to the second hole.

3. The device of claim 1 wherein a plurality of said apertures extend through said plate.

4. The device of claim 1 wherein the plate is solid.

5. The device of claim 1 wherein the first hole and the second hole are shaped in substantially the same geometric shape.

6. The device of claim 1 wherein the first hole and the second hole are concentric.

7. The device of claim 1 wherein the first hole and the second hole are substantially square shaped.

8. The device of claim 1 wherein ten of said apertures are placed in a predetermined position and extend through said plate.

9. The device of claim 1 wherein said plate further comprises at least one flange positioned adjacent to the front and back sides of said plate.

10. The device of claim 1 wherein the tray is a JEDEC tray.

11. The device of claim 1 further comprising at least one beveled side on an angle within the range of from about 3 to about 80 degrees from a vertical axis.

12. The device of claim 1 further comprising at least one beveled side on an angle of approximately 10 degrees.

13. The device of claim 1 further comprising at least one smooth beveled side.

14. The device of claim 1 wherein the plate comprises a longitudinally extending body having a first end and a second end, wherein the first surface is a longitudinally extending upper surface and the second surface is a longitudinally extending lower surface, the upper surface including a first flat portion, the lower surface having a second flat portion generally parallel to the first flat portion.

15. The device of claim 14 further comprising a longitudinal center axis extending through the first flat portion from the first end to the second end, wherein said plurality of apertures are positioned on either side of the axis.

16. The device of claim 15 wherein a plurality of apertures are positioned on both sides of the axis.

17. The device of claim 15 wherein said plurality of apertures are positioned in predetermined equidistant positions from the axis.

18. The plate of claim 1 comprising four beveled sides.

19. The device of claim 18 wherein the each of the four beveled sides are smooth and comprise an angle of between about 3 to about 30 degrees.

20. The device of claim 1 wherein the first hole is the top hole.

21. The device of claim 1 wherein said material placed in first hole exits second hole, and wherein second hole is sized to generally correspond to said material.

22. The device of claim 1 further comprising an exaggerated corner extending through the plate.

23. The device of claim 1 wherein the catch and grooved portion each include beveled edges which mate with one another.

24. A process of manipulating semiconductor components comprising:
   contacting a component from a first substrate with a surface of a lifter,
   transferring the component and the surface of the lifter through a plate comprising a first end, a second end, a front side, a back side, a first surface, a second surface, and at least one aperture extending through the plate from a first hole in the first surface to a second hole in the second surface, wherein the first hole is larger than the second hole and wherein the plate includes a catch extending from the first and second ends of the plate, the plate correcting the alignment of the component on the surface of the lifter while maintaining the component on the surface of the lifter,
   keying a tray to the plate, wherein the catch attaches to a grooved portion of the tray;
   transferring the component from the surface of the lifter to a second substrate, wherein the plate is moved using at least one clip connected to the plate, wherein the at least one clip includes a mating portion; and
   attaching a plate lifting unit to the mating portion, wherein the mating portion enables movement of the plate when the mating portion is attached to the plate lifting unit.

25. The process of claim 24 wherein the aperture further comprises at least one beveled side extending from the first hole to the second hole.

26. The process of claim 24 wherein a plurality of said apertures extend through said plate.

27. The process of claim 24 wherein the plate is solid.

28. The process of claim 24 wherein the first hole and the second hole are shaped in substantially the same geometric shape.

29. The process of claim 23 wherein the first hole and the second hole are concentric.

30. The process of claim 24 wherein the first hole and the second hole are substantially square shaped.

31. The process of claim 24 wherein ten apertures are placed in a predetermined position and extend through said plate.

32. The process of claim 24 wherein said plate further comprises at least one flange positioned adjacent to the front and back sides of said plate.

33. The process of claim 24 wherein the tray is a JEDEC tray.

34. The process of claim 24 wherein said aperture further comprises at least one beveled side angled within the range of from about 5 to about 60 degrees.

35. The process of claim 24 wherein said aperture further comprises at least one beveled side sloped on an angle of approximately 10 degrees.

36. The process of claim 24 wherein said aperture further comprises at least one smooth beveled side extending between the first hole and the second hole.

37. The process of claim 24 wherein the plate comprises a longitudinally extending body having a first end and a second end, wherein the first surface is a longitudinally extending upper surface and the second surface is a longitudinally extending lower surface, the upper surface including a first flat portion, the lower surface having a second flat portion generally parallel to the first flat portion.

38. The process of claim 37 wherein the plate further comprises a longitudinal center axis extending through the first flat portion from the first end to the second end, wherein said plurality of apertures are positioned on either side of the axis.

39. The process of claim 38 wherein a plurality of apertures are positioned on both sides of the axis.

40. The process of claim 38 wherein said plurality of apertures are positioned in predetermined equidistant positions from the axis.

41. The process of claim 24 wherein the plate further comprises four beveled sides extending between the first hole and the second hole.

42. The process of claim 41 wherein each of the four beveled sides are smooth and comprise an angle of between about 3 to about 45 degrees.

43. The process of claim 24 wherein further comprising moving the component through the first hole and then through the second hole.

44. The process of claim 24 wherein the step of transferring the component further comprises positioning the plate in a transferring machine.

45. A system for loading electronic packages into a tray comprising:
- a first loader station to load a substrate tray into the system;
- a second loader station to load a pallet into the system, the pallet having electronic packages disposed thereon;
- a funnel station coupled to said first loader station and said second loader station to funnel electronic packages, wherein the funnel station further comprises at least one funnel plate comprising a first end, a second end, a front side, a back side, a first surface, a second surface, and at least one aperture extending through said plate from a first hole in the first surface to a second hole in the second surface, wherein the first hole is larger than the second hole and wherein the plate includes a catch extending from each of the first and second ends of the plate;
- a tray keyed to the plate, wherein the catch attaches to a grooved portion of the tray;
- a transfer head comprising at least one lifter for transferring the electronic packages from the pallet to the substrate tray through the funnel plate;
- at least one clip connected to the funnel plate; and
- a plate lifting unit which attaches to a mating portion of the at least one clip, wherein mating portion enables movement of the funnel plate when the mating portion is attached to the plate lifting unit; and
- wherein the at least one lifter contacts an electronic package on the pallet with a surface of the lifter, transfers the electronic package and the surface of the lifter through the at least one aperture in the plate, and seats the electronic package on the substrate tray.

46. The system of claim 45 further comprising a first actuator coupled to the substrate tray.

47. The system of claim 46 further comprising a second actuator coupled to said funnel station, the second actuator to raise and lower at least one funnel plate.

48. The system of claim 47 further comprising a third actuator coupled to said second loader station, the third actuator to feed and remove the pallet from the system.

49. The system of claim 48 further comprising a fourth actuator coupled to said transfer head, the fourth actuator for raising and lowering the transfer head and at least one lifter.

50. The system of claim 49 comprising a plurality of lifters.

51. The system of claim 49 wherein the transfer head is positioned above the funnel station.

* * * * *